United States Patent
Fuller et al.

(10) Patent No.: US 9,488,293 B2
(45) Date of Patent: Nov. 8, 2016

(54) ON-OFF MICROVALVE WITH IMPROVED SEALING MECHANISM

(71) Applicant: DunAn Microstaq, Inc., Austin, TX (US)

(72) Inventors: Edward Nelson Fuller, Manchester, MI (US); Parthiban Arunasalam, Austin, TX (US); Chen Yang, Austin, TX (US); Joe A. Ojeda, Sr., Austin, TX (US); Gengxun K. Gurley, Hutto, TX (US)

(73) Assignee: DunAn Microstaq, Inc., Austin, TX (US)

( * ) Notice: Subject to any disclaimer, the term of this patent is extended or adjusted under 35 U.S.C. 154(b) by 0 days.

(21) Appl. No.: 14/743,095

(22) Filed: Jun. 18, 2015

(65) Prior Publication Data

US 2016/0047490 A1  Feb. 18, 2016

Related U.S. Application Data

(60) Provisional application No. 62/037,319, filed on Aug. 14, 2014.

(51) Int. Cl.
*F16K 99/00* (2006.01)
*B01L 3/00* (2006.01)
*B81B 1/00* (2006.01)

(52) U.S. Cl.
CPC .......... *F16K 99/0011* (2013.01); *B01L 3/5027* (2013.01); *B81B 1/00* (2013.01); *Y10T 137/2224* (2015.04)

(58) Field of Classification Search
CPC .... F16K 99/0011; B81B 1/00; B01L 3/5027; Y10T 37/2224
See application file for complete search history.

(56) References Cited

U.S. PATENT DOCUMENTS 6,390,782 B1 * 5/2002 Booth ................ F04B 27/1804
                                                      417/222.2
6,540,203 B1  4/2003 Hunnicutt
(Continued)

FOREIGN PATENT DOCUMENTS

CN      101675280 B    5/2013
WO     2008121369 A1   10/2008

*Primary Examiner* — Craig Schneider
*Assistant Examiner* — Kevin Barss
(74) *Attorney, Agent, or Firm* — MacMillan, Sobanski & Todd, LLC

(57) ABSTRACT

A microvalve includes a first plate having a surface, a recessed region provided within the surface, a fluid port provided within the recessed region, and a sealing structure extending about the fluid port. A second plate defines a non-movable portion and a movable portion formed within the first opening and having an axis. A surface of the non-movable portion abuts the surface of the first plate, the non-movable portion having first and second openings formed therethrough. The first opening has a notch formed in each of two longitudinally extending side walls thereof. The movable portion defines a displaceable member connected to the non-movable portion by a convoluted spring formed in a second opening. The displaceable member has a tab extending outwardly from each of two longitudinally extending side walls thereof, each tab positioned within one of the notches. The displaceable member is slidingly and axially movable within the first opening between a closed position, wherein the displaceable member cooperates with the sealing structure to prevent fluid communication through the fluid port, and an opened position, wherein the displaceable member does not cooperate with at least a portion of the sealing structure to prevent fluid communication through the fluid port. The notches define stop surfaces that limit travel of the displaceable member between the closed position and the open position.

16 Claims, 5 Drawing Sheets

(56) References Cited

U.S. PATENT DOCUMENTS

| | | |
|---|---|---|
| 6,755,761 B2 | 6/2004 | Hunnicutt et al. |
| 7,011,378 B2 * | 3/2006 | Maluf ............... B81B 3/0024 137/14 |
| 7,210,502 B2 * | 5/2007 | Fuller ............... F04B 27/1804 137/596.16 |
| 7,438,030 B1 * | 10/2008 | Okojie ............... F16K 99/0001 123/90.11 |
| 8,011,388 B2 * | 9/2011 | Fuller ............... F16K 99/0001 137/625.65 |
| 8,113,482 B2 | 2/2012 | Hunnicutt |
| 8,156,962 B2 | 4/2012 | Luckevich |
| 8,387,659 B2 | 3/2013 | Hunnicutt |
| 9,328,850 B2 * | 5/2016 | Fuller ............... F16K 99/0021 |
| 2016/0047489 A1 * | 2/2016 | Fuller ............... F16K 99/0011 251/327 |

* cited by examiner

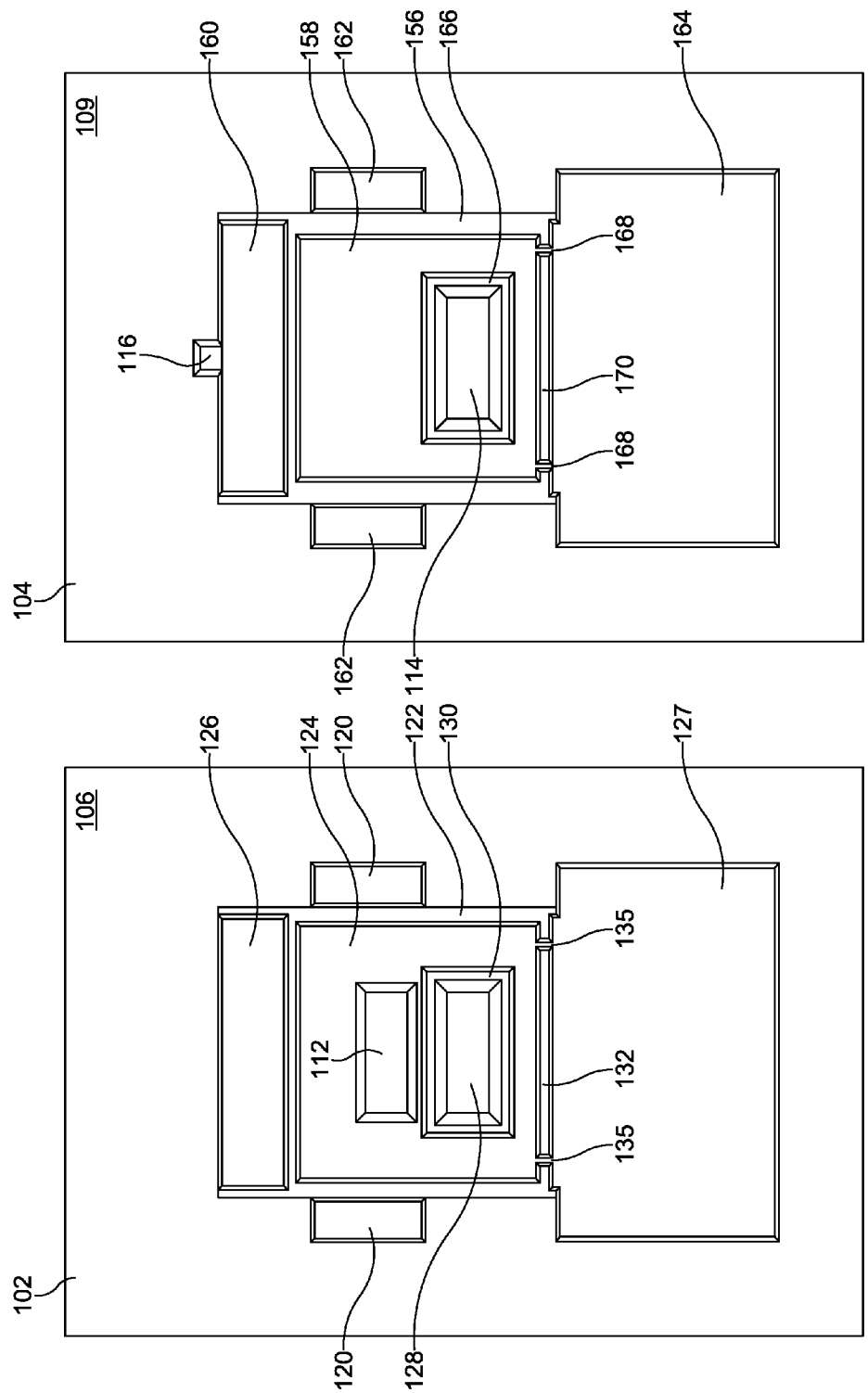

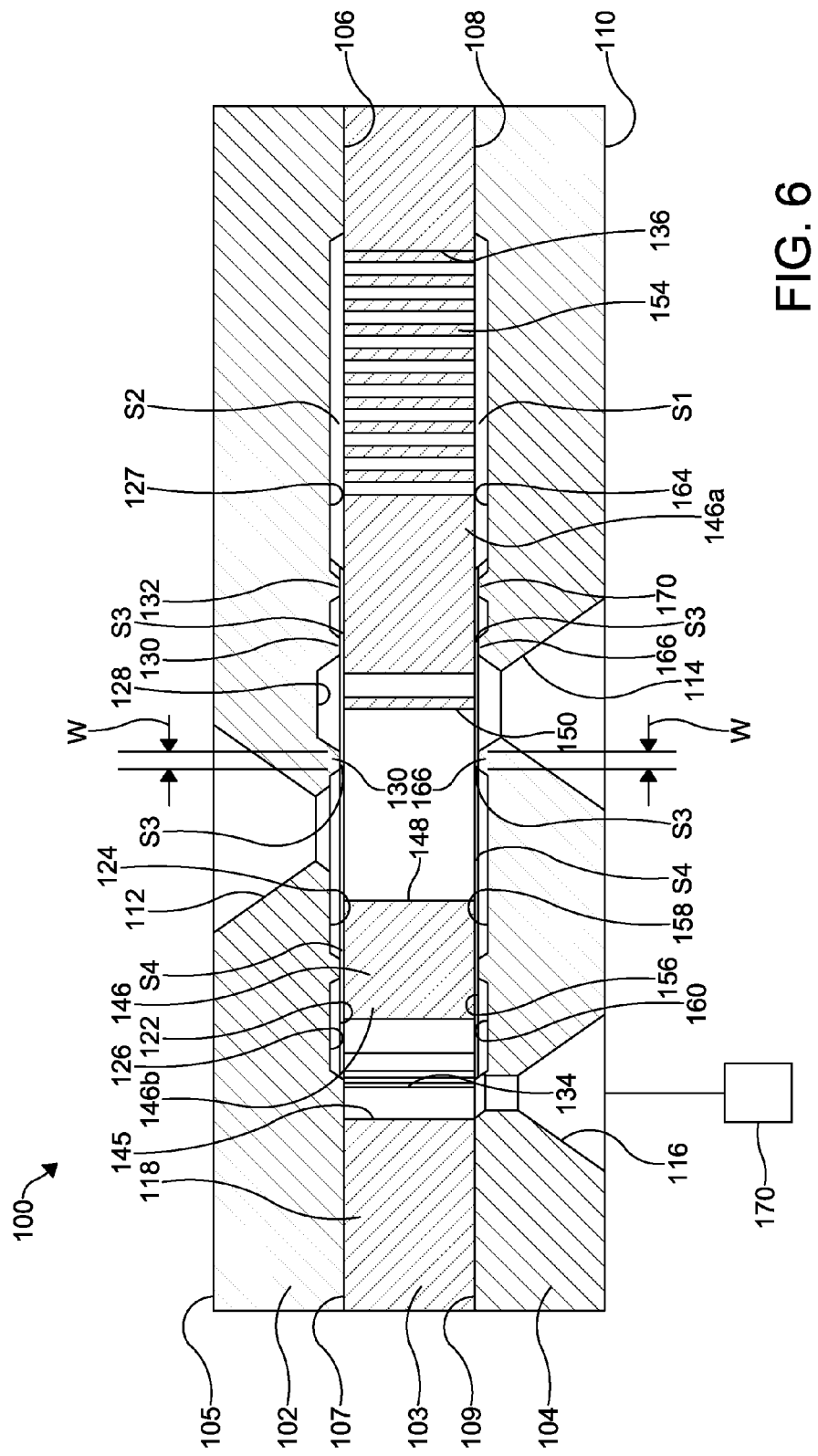

ON-OFF MICROVALVE WITH IMPROVED SEALING MECHANISM

CROSS REFERENCE TO RELATED APPLICATIONS

This application claims the benefit of U.S. Provisional Application No. 62/037,319 filed Aug. 14, 2014, the disclosure of which is incorporated herein by reference.

BACKGROUND OF THE INVENTION

This invention relates in general to microvalves for controlling the flow of fluid through a fluid circuit. In particular, this invention relates to an improved structure for an on-off microvalve that resists interference with the free movement of a displaceable member of the plate microvalve that might otherwise result from the presence of particulate contaminants contained in the fluid flowing therethrough.

Generally speaking, a micro-electro-mechanical system is a system that not only includes both electrical and mechanical components, but is additionally physically small, typically including features having sizes in the range of ten micrometers or smaller. The term "micro-machining" is commonly understood to relate to the production of three-dimensional structures and moving parts of such micro-electro-mechanical system devices. In the past, micro-electro-mechanical systems used modified integrated circuit (e.g., computer chip) fabrication techniques (such as chemical etching) and materials (such as silicon semiconductor material), which were micro-machined to provide these very small electrical and mechanical components. More recently, however, other micro-machining techniques and materials have become available.

As used herein, the term "micro-machined device" means a device including features having sizes in the micrometer range or smaller and, thus, is at least partially formed by micro-machining. As also used herein, the term "microvalve" means a valve including features having sizes in the micrometer range or smaller and, thus, is also at least partially formed by micro-machining. Lastly, as used herein, the term "microvalve device" means a micro-machined device that includes not only a microvalve, but further includes additional components. It should be noted that if components other than a microvalve are included in the microvalve device, these other components may be either micro-machined components or standard-sized (i.e., larger) components. Similarly, a micro-machined device may include both micro-machined components and standard-sized components.

A variety of microvalve structures are known in the art for controlling the flow of fluid through a fluid circuit. One well known microvalve structure includes a displaceable member that is supported within a closed internal cavity provided in a valve body for pivoting, axial, or other movement between a closed position and an opened position. When disposed in the closed position, the displaceable member substantially blocks a first fluid port that is otherwise in fluid communication with a second fluid port, thereby preventing fluid from flowing between the first and second fluid ports. When disposed in the opened position, the displaceable member does not substantially block the first fluid port from fluid communication with the second fluid port, thereby permitting fluid to flow between the first and second fluid ports.

In this conventional microvalve structure, the thickness of the closed internal cavity is usually only slightly larger than the thickness of the displaceable member disposed therein. Thus, relatively small spaces are provided between the displaceable member and the adjacent portions of the microvalve that define the closed internal cavity. This is done so as to minimize the amount of undesirable leakage therethrough when the displaceable member is disposed in the closed position. However, it has been found that when this conventional microvalve structure is used to control the flow of fluid containing solid particles (such as particulate contaminants that may be contained within the fluid), such particles may become jammed between the displaceable member and the adjacent portions of the microvalve that define the closed internal cavity. The jamming of such particles can, in some instances, undesirably interfere with the free movement of the displaceable member between the closed and opened positions. Thus, it would be desirable to provide an improved structure for a microvalve that resists interference with the free movement of a displaceable member of the microvalve that might otherwise result from the presence of particulate contaminants contained in the fluid flowing therethrough.

SUMMARY OF THE INVENTION

This invention relates to an improved structure for an on-off microvalve that resists interference with the free movement of a displaceable member of the microvalve that might otherwise result from the presence of particulate contaminants contained in the fluid flowing therethrough. The on-off microvalve includes a first plate having a surface, a recessed region provided within the surface, a fluid port provided within the recessed region, and a sealing structure extending about the fluid port. A second plate defines a non-movable portion and a movable portion formed within the first opening and having an axis. A surface of the non-movable portion abuts the surface of the first plate, the non-movable portion having first and second openings formed therethrough. The first opening has a notch formed in each of two longitudinally extending side walls thereof. The movable portion defines a displaceable member connected to the non-movable portion by a convoluted spring formed in a second opening. The displaceable member has a tab extending outwardly from each of two longitudinally extending side walls thereof, each tab positioned within one of the notches. The displaceable member is slidingly and axially movable within the first opening between a closed position, wherein the displaceable member cooperates with the sealing structure to prevent fluid communication through the fluid port, and an opened position, wherein the displaceable member does not cooperate with at least a portion of the sealing structure to prevent fluid communication through the fluid port. The notches define stop surfaces that limit travel of the displaceable member between the closed position and the open position.

Various aspects of this invention will become apparent to those skilled in the art from the following detailed description of the preferred embodiments, when read in light of the accompanying drawings.

BRIEF DESCRIPTION OF THE DRAWINGS

FIG. 3 is a plan view of an inner surface of the cover plate illustrated in FIG. 2.

FIG. 4 is a plan view of an inner surface of the base plate illustrated in FIG. 2.

FIG. 6 is a first alternate sectional elevational view the microvalve illustrated in FIGS. 2 and 5 showing the intermediate plate in the open position.

DETAILED DESCRIPTION OF THE PREFERRED EMBODIMENTS

Figure 1:
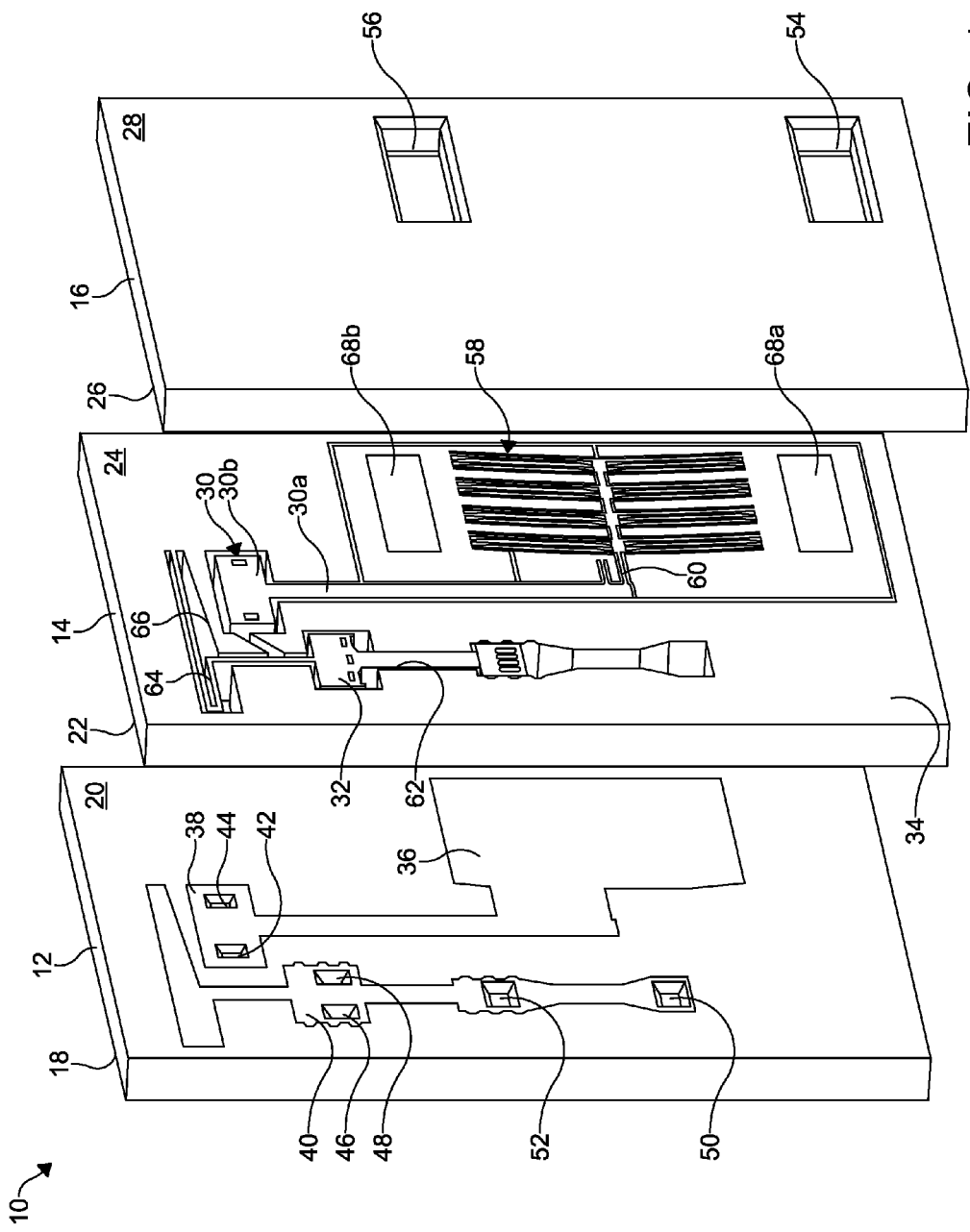
FIG. 1 is an exploded perspective view of a known microvalve.

Referring now to the drawings, an embodiment of a known microvalve device is indicated generally at 10 in FIG. 1. The illustrated microvalve device 10 is a pilot operated microvalve device, similar to the embodiments of the microvalve devices disclosed in U.S. Pat. No. 6,540,203 to Hunnicutt, the disclosure of which in incorporated herein in its entirety.

The microvalve device 10 includes a direct-acting pilot valve and a slider valve in one device having a cover plate, an intermediate plate, and a base plate, the detailed descriptions for which are provided in U.S. Pat. No. 6,540,203.

As shown in FIG. 1, the microvalve device 10 includes a port or base plate 12, an intermediate plate 14, and a cover plate 16. The base plate 12 has an outer surface 18 and an inner surface 20. The intermediate plate 14 has a first surface 22 and a second surface 24 and defines first and second movable portions or microvalves 30 and 32, described below, and a non-movable portion 34. The base plate 12 has an inner surface 26 and an outer surface 28.

When the microvalve device 10 is assembled (not shown), the inner surface 20 of the base plate 12 engages the first surface 22 of the non-movable portion 34 of the intermediate plate 14, and the inner surface 26 of the cover plate 16 engages the second surface 24 of the non-movable portion 34 of the intermediate plate 14. The base plate 12, the intermediate plate 14, and the cover plate 16 may be retained in this orientation in any desired manner.

The structure of the inner surface 20 of the base plate 12 is illustrated in FIG. 1. As shown therein, the base plate 12 includes a first recessed region 36, a second recessed region 38, and a third recessed region 40. First and second pilot ports, 42 and 44 respectively, are formed in the inner surface 20 within the second recessed region 38. First and second exhaust ports, 46 and 48 respectively, and first and second primary ports, 50 and 52 respectively, are formed in the inner surface 20 within the third recessed region 40.

As also shown in FIG. 1, the cover plate 16 includes first and second electrical lead openings, 54 and 56 respectively, formed therethrough. Recessed regions (not shown), corresponding to the recessed regions 36, 38, and 40, are formed in the inner surface 26 of the cover plate 16.

The structure of the intermediate plate 14 is illustrated in detail in FIG. 1. As shown therein, the intermediate plate 14 includes the first microvalve configured as a direct-acting pilot valve 30, and the second microvalve configured as a slider valve 32. The intermediate plate 14 also includes an actuator 58 for controlling the movement of the pilot valve 30. The actuator 58 includes an elongated spine 60 attached to the beam 30a of the pilot valve 30. The pilot valve 30 is substantially T-shaped and includes an elongated beam 30a attached at one end to the spine 60 of the actuator 58, and a blocking portion 30b attached at an opposite end of the beam 30a.

The slider valve 32 is also is substantially T-shaped, disposed in a valve opening 62 formed through the intermediate plate 14, and movable between open and closed positions.

The intermediate plate 14 also includes a convoluted spring 64, disposed in a spring opening 66. The convoluted spring 64 moveably connects the non-movable portion 34 of the intermediate plate 14 to the slider valve 32, and preferably biases the slider valve 32 to the first position. The convoluted spring 64 also retains the slider valve 32 in the valve opening 62. A pair of electrical bond pads, 68a and 68b respectively, is formed on the second surface 24 of the non-movable portion 34 of the intermediate plate 14 and electrically connects the intermediate plate 14 to electrical leads (not shown).

A detailed description of the operation of the illustrated microvalve device 10 is disclosed in U.S. Pat. No. 6,540,203 to Hunnicutt. As described therein, the actuator 58 controls the placement of the pilot valve 30. In turn, the placement of the pilot valve 30 controls the fluid pressure acting on a first end of the slider valve 32 (the upper end when viewing FIG. 1). The difference between the fluid forces acting on the opposite ends of the slider valve 32 in turn controls the position of the slider valve 32 within the valve opening 62. The placement of the slider valve 32 within the valve opening 62 then controls the flow fluid between the first and second primary ports, 50 and 52 respectively.

A first relatively small space is defined between the recessed regions 36, 38, and 40 provided on the inner surface 20 of the base plate 12 and the adjacent first surface 22 of the pilot valve 30 and the slider valve 32. The thickness of this first relatively small space has traditionally been about 3 µm in order to prevent excessive leakage through the microvalve device 10.

Similarly, a second relatively small space is defined between the recessed regions (not shown) provided on the inner surface 26 of the cover plate 16 and the adjacent second surface 24 of the pilot valve 30 and the slider valve 32. The thickness of this second relatively small space has traditionally also been about 3 µm in order to prevent excessive leakage through the microvalve device 10.

In order to minimize leaking through the conventional microvalve device 10 illustrated in FIG. 1, it is desirable that the thicknesses of the relatively small spaces be as small as possible. However, because the thicknesses of these relatively small spaces are not only relatively small, but are constant throughout the entire surface area of the pilot valve 30 and the slider valve 32, then the likelihood increases that one or more particles (not shown) contained in the fluid leaking through such relatively small spaces may become jammed therebetween. In other words, the particles may become jammed between either (1) the recessed regions 36, 38, and 40 provided on the inner surface 20 of the base plate 12 and the adjacent first surface 22 of the pilot valve 30 and the slider valve 32, or (2) the corresponding recessed regions (not shown) provided on the inner surface 26 of the cover plate 16 and the adjacent second surface 24 of the pilot valve 30 and the slider valve 32.

FIGS. 2 through 6 illustrate portions of an improved microvalve, indicated generally at 100, in accordance with a first embodiment of this invention that minimizes the likelihood of such undesirable jamming. The illustrated microvalve 100 is a pilot operated on-off plate microvalve that includes improved sealing structures, described in detail below.

Figure 2:
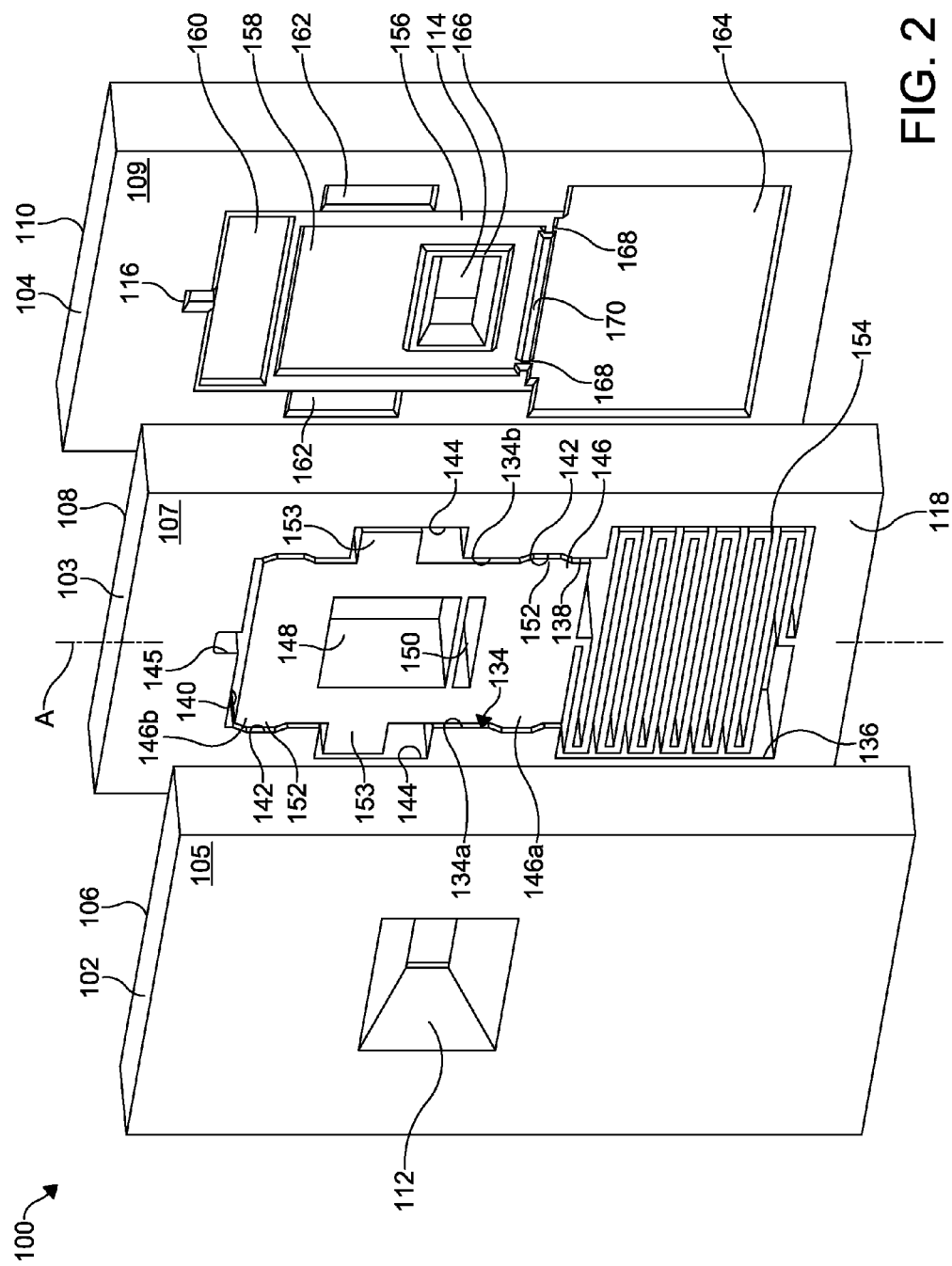
FIG. 2 is an exploded perspective view of an improved pilot operated on-off plate microvalve in accordance with this invention.

As shown in FIG. 2, the microvalve 100 includes a cover plate 102, an intermediate plate 103, and a base plate 104.

The cover plate 102 has an outer surface 105 and an inner surface 106. The cover plate 102 also has a fluid outlet port 112 formed therethrough. The intermediate plate 103 has a first surface 107 and a second surface 108. The base plate 104 has an inner surface 109 and an outer surface 110. The base plate 104 also has a fluid inlet port 114, and a pressure control port 116 formed therethrough.

Figure 5:
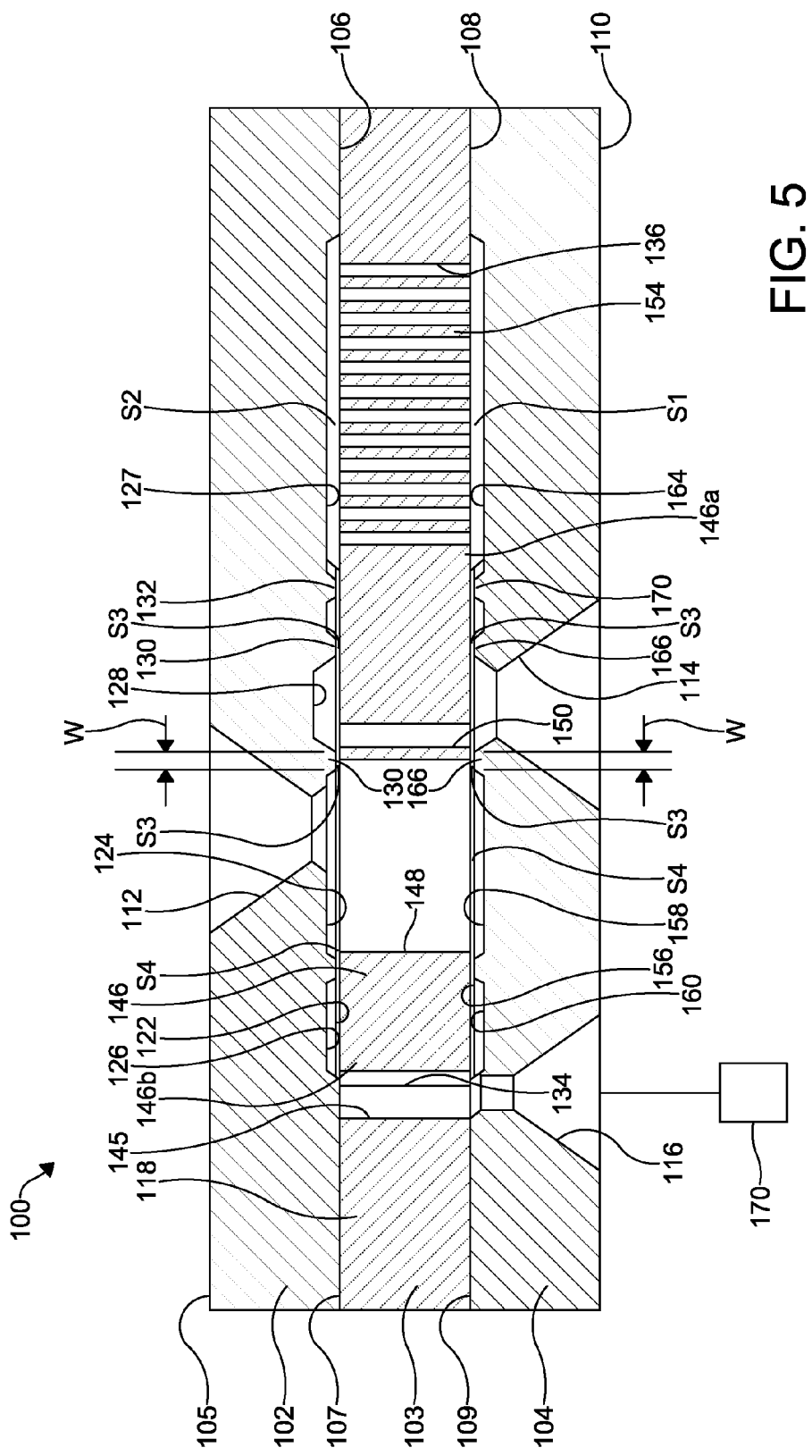
FIG. 5 is a sectional elevational view of the microvalve illustrated in FIG. 2 shown assembled and showing the intermediate plate in the closed position.

When the microvalve 100 is assembled as shown in FIGS. 5 and 6, the inner surface 106 of the cover plate 102 engages the first surface 107 of a non-movable portion 118 of the intermediate plate 103, and the inner surface 109 of the base plate 104 engages the second surface 108 of the non-movable portion 118 of the intermediate plate 103. The cover plate 102, the intermediate plate 103, and the base plate 104 may be retained in this orientation in any desired manner. For example, portions of the cover plate 102 and/or the base plate 104 may be bonded to non-movable portions of the intermediate plate 103 by any of the methods described above for bonding the component plates of the microvalve 100. The cover plate 102, the intermediate plate 103, and the base plate 104 may be composed of any desired material or combination of materials, such as silicon, single crystal silicon, and/or similar materials.

The structure of the inner surface 106 of the cover plate 102 is illustrated in detail in FIG. 3. As shown therein, the cover plate 102 includes a first recessed region 122 having a first depth of approximately 3 µm. A second recessed region 124 and a third recessed region 126 are formed within the first recessed region 122 and have a second depth of approximately 50 µm. A pair of fourth recessed regions 120 are formed in the inner surface 106 adjacent and on opposite sides of the second recessed region 124. The fourth recessed regions 120 also have the second depth of approximately 50 µm. A fifth recessed region 127 is provided on the inner surface 106 adjacent the second recessed region 124 (below the second recessed region 124 when viewing FIG. 3) and has the second depth of approximately 50 µm. The fluid outlet port 112 is formed through the second recessed region 124. A pressure equalization trough 128 is also formed the inner surface 106 within the second recessed region 124.

The cover plate 102 also includes a first sealing structure 130 that extends from the bottom surface of the second recessed region 124 and completely about the perimeter of the first pressure equalization trough 128. Channels 135 are formed in the inner surface 106 of the cover plate 102 and through a portion of a wall 132 that separates the second recessed region 124 from the fifth recessed region 127. The channels 135 fluidly connect the second recessed region 124 and the fifth recessed region 127 and define feedback ports. In the embodiment illustrated, two channels 135 are shown. Alternatively, any desired number of channels 135 may be provided, including one channel 135 and three or more channels 135.

In the illustrated embodiment, the sealing structure 130 is a wall that is generally trapezoidal in cross-sectional shape and has a width W at its top of about 70 µm, as shown in FIG. 5. Alternatively, the width W may be within the range of from about 40 µm to 120 µm. The sealing structure 130 includes four linearly-extending wall segments that extend adjacent to the four sides of the pressure equalization trough 128. The sealing structure 130 may however, be formed having any desired cross-sectional shape or combination of shapes, and may further extend in any desired manner (linearly or otherwise) about the pressure equalization trough 128. For example, the sealing structure 130 may be formed substantially as shown in FIGS. 5 and 6, but may have rounded corners between adjacent linearly-extending wall segments, have one or more non-linearly-extending wall segments, or be entirely non-linear in shape.

The structure of the intermediate plate 103 is illustrated in detail in FIG. 2. As shown therein, a first or plate opening 134, and an adjacent and preferably rectangular second or spring opening 136 are formed in the intermediate plate 103. The plate opening 134 and the spring opening 136 are in fluid communication with each other.

The plate opening 134 has a first end 138 and a second end 140 opposite the first end 138. Each of the walls 134a and 134b of the plate opening 134 that extend between the first end 138 and the second end 140 has a plurality of outwardly extending recesses 142 formed therein, the purpose of which will be described below. A pair of outwardly extending notches 144 are also formed in the walls 134a and 134b intermediate the first end 138 and the second end 140 of the plate opening 134. A fluid flow notch 145 is formed at the second end 140 of the plate opening 134 and allows fluid flow between the pressure control port 116 and the plate opening 134.

The intermediate plate 103 further includes a moveable portion configured as a displaceable member or plate 146 disposed in the plate opening 134 between the first and second ends 138 and 140 of the plate opening 134. The displaceable plate 146 has a first end 146a disposed nearest the first end 138 of the plate opening 134 and defining an axis A. The displaceable plate 146 has a second end 146b disposed nearest the second end 140 of the plate opening 134.

The displaceable plate 146 has a relatively large and centrally formed fluid flow opening 148 formed therethrough. A pressure balance port 150 is also formed through the displaceable plate 146 adjacent the fluid flow opening 148.

The displaceable plate 146 further has a plurality of protrusions 152 defined on side walls thereof. Each of the protrusions 152 is aligned with a corresponding one of the recesses 142 formed in the walls of the plate opening 134 when the displaceable plate 146 is in the closed position, as shown in FIG. 2. When the protrusions 152 are aligned with the recesses 142, a leak path between the protrusions 152 and the recesses 142 is minimized. The protrusions 152 are sufficiently shallow; i.e., have a minimal thickness, so as not to interfere with the travel of the displaceable plate 146 within the plate opening 134. However, when the displaceable plate 146 is in the open position, as shown in FIG. 6, the outwardly extending protrusions 152 on the displaceable plate 146 are no longer aligned with the corresponding outwardly extending recesses 142, and the protrusions 152 are closer and have a reduced clearance relative to the non-recessed portions of the walls of the plate opening 134.

A pair of tabs 153 extends outwardly from the side walls of the displaceable plate 146 intermediate the first and second ends, 146a and 146b, respectively. Each of the tabs 153 is aligned with and positioned within a corresponding one of the notches 144 formed in the walls 134a and 134b of the plate opening 134. The notches 144 define stop surfaces that limit travel of the displaceable plate 146 between the closed position and the open position.

The intermediate plate 103 also includes a convoluted spring 154, disposed in the spring opening 136. The convoluted spring 154 moveably connects the non-movable portion 118 of the intermediate plate 103 to the displaceable plate 146, and preferably biases the displaceable plate 146 to the closed position. The convoluted spring 154 also retains the displaceable plate 146 in the plate opening 134, simplifying handling of the intermediate plate 103 during manufacture. A variable volume region 156 is defined between the displaceable plate 146 and the second end 140 of the plate opening 134 when the displaceable plate 146 is in the open position.

The displaceable plate 146 is movable between a closed or off position, as shown in FIGS. 2 and 5 and described in detail below, wherein the fluid inlet port 114 is closed, and an open or on position wherein the second end 146b is spaced a distance apart from the second end 140 of the plate opening 134, as best shown in FIG. 6, and wherein the fluid inlet port 114 is open such that fluid may flow therethrough.

The structure of the inner surface 109 of the base plate 104 is illustrated in detail in FIG. 4. As shown therein, the base plate 104 includes a first recessed region 156 having a first depth of approximately 3 µm. A second recessed region 158 and a third recessed region 160 are formed within the first recessed region 156 and have a second depth of approximately 50 µm. A pair of fourth recessed regions 162 are formed in the inner surface 109 adjacent and on opposite sides of the second recessed region 158. The fourth recessed regions 162 also have the second depth of approximately 50 µm. A fifth recessed region 164 is provided on the inner surface 109 adjacent the second recessed region 158 (below the second recessed region 158 when viewing FIG. 4) and has the second depth of approximately 50 µm. The fluid inlet port 114 is formed through the second recessed region 158. The pressure control port 116 is formed through the base plate 104 adjacent the third recessed region 160 (above the third recessed region 160 when viewing FIG. 4).

The base plate 104 also includes a second sealing structure 166 that extends from the bottom surface of the second recessed region 158 and completely about the perimeter of the fluid inlet port 114. Channels 168 are formed in the inner surface 109 of the base plate 104 and through a portion of a wall 170 that separates the second recessed region 158 from the fifth recessed region 164. The channels 168 fluidly connect the second recessed region 158 and the fifth recessed region 164 and define feedback ports. In the embodiment illustrated, two channels 168 are shown. Alternatively, any desired number of channels 168 may be provided, including one channel 168 and three or more channels 168. Advantageously, the feedback ports 135, described above, and the feedback ports 168, allow the improved microvalve 100 to be used as either an on-off valve or as a proportional orifice valve.

For example, command pressure entering the microvalve 100 through the pressure control port 116 acts on the second end 146b of the displaceable plate 146 and urges the displaceable plate 146 toward the open position (downward when viewing FIG. 2). Pressure from fluid entering the microvalve 100 through the fluid inlet port 114 will increase pressure in the second recessed region 158 of the base plate 104 and the corresponding second recessed region 124 of the cover plate 102. This pressure in the recessed regions 158 and 124 is communicated to the fifth recessed region 164 of the base plate 104 and the corresponding fifth recessed region 127 of the cover plate 102 through the channels 168 formed in the base plate 104 and the channels 135 formed in the cover plate 102, respectively. The fluid pressure in the regions 164 and 127 will then act on the first end 146a of the displaceable plate 146 to balance command pressure and to urge the displaceable plate 146 toward the closed position (upward when viewing FIG. 2).

In the illustrated embodiment, the sealing structure 166 is a wall that is generally trapezoidal in cross-sectional shape and has a width W at its top of about 70 µm, as shown in FIG. 5. Alternatively, the width W may be within the range of from about 40 µm to 162 µm. The sealing structure 166 includes four linearly-extending wall segments that extend adjacent to the four sides of the fluid inlet port 114. The sealing structure 166 may however, be formed having any desired cross-sectional shape or combination of shapes, and may further extend in any desired manner (linearly or otherwise) about the fluid inlet port 114. For example, the sealing structure 166 may be formed substantially as shown in FIGS. 5 and 6, but may have rounded corners between adjacent linearly-extending wall segments, have one or more non-linearly-extending wall segments, or be entirely non-linear in shape.

As shown in FIGS. 5 and 6, a first space S1 is defined between bottom surfaces of the recessed regions 158, 160, 162 (shown only in FIG. 4), and 164 of the base plate 104 and the second surface 108 of the displaceable plate 146 of the intermediate plate 103. A second space S2 is also defined between bottom surfaces of the recessed regions 120 (shown only in FIG. 3), 124, 126, and 127 of the cover plate 102 and the first surface 107 of the displaceable plate 146 of the intermediate plate 103. The thickness of the first and second spaces S1 and S2 may be any desired value that is not likely to result in one or more particles (not shown) contained in fluid flowing through the first and second spaces S1 and S2 becoming jammed therein. For example, the thickness of the first and second spaces S1 and S2 may be approximately 50 µm.

Additionally, a relatively small third space S3 is defined between a top surface of the sealing structure 166 of the base plate 104 and the second surface 108 of the displaceable plate 146 of the intermediate plate 103, and between a top surface of the sealing structure 130 of the cover plate 102 and the first surface 107 of the displaceable plate 146 of the intermediate plate 103. The thickness of the relatively small third space S3 may be any desired value that is not likely to result in excessive leakage as describe above. For example, the thickness of the relatively small third space S3 may be approximately 3 µm.

A relatively small fourth space S4 is defined between a bottom surface of the first recessed region 122 of the cover plate 102 and the first surface 107 of the displaceable plate 146 of the intermediate plate 103, and between a bottom surface of the first recessed region 156 of the base plate 104 and the second surface 108 of the displaceable plate 146 of the intermediate plate 103. The thickness of the relatively small fourth space S4 may be any desired value. For example, the thickness of the relatively small fourth space S4 may be approximately 3 µm.

The operation of the pilot operated on-off plate microvalve 100 described herein is similar to the operation of the slider valve 32 of the microvalve device 10 described above and the slider valves disclosed in U.S. Pat. No. 6,540,203 to Hunnicutt. For example, and as described above, the actuator 58 of the microvalve device 10 controls the placement of the pilot valve 30. In turn, the placement of the pilot valve 30 controls the fluid pressure acting on a first end of the slider valve 32 (the upper end when viewing FIG. 1). The difference between the fluid forces action on the opposite ends of the slider valve 32 in turn controls the position of the slider valve 32 within the valve opening 62. The placement of the slider valve 32 within the valve opening 62 then controls the flow fluid between the first and second primary ports, 50 and 52 respectively.

During use, the microvalve 100 may be operated in a conventional manner (or otherwise) to selectively move the displaceable plate 146 between the closed position (illustrated in FIGS. 2 and 5) and the open position (illustrated in FIG. 6). When the displaceable plate 146 is located in the closed position, it is desirable that as little fluid as possible flows between both of the fluid inlet port 114 and pressure equalization trough 128 and the fluid outlet port 112. This is accomplished by providing the second sealing structure 166 that extends from the bottom surface of the second recessed region 158 and completely about the perimeter of the fluid inlet port 114, and the first sealing structure 130 that extends from the bottom surface of the second recessed region 124 and completely about the perimeter of the pressure equalization trough 128.

At the same time, the geometry of the microvalve 100 resists interference with the free movement of the displaceable plate 146 of the microvalve 100 that might otherwise result from the presence of particulate contaminants contained in the fluid flowing therethrough. This is accomplished by providing (1) the first space S1 between the recessed regions 158, 160, 162, and 164 provided on the base plate 104 and the adjacent second surface 108 (the lower surface when viewing FIGS. 5 and 6) of the displaceable plate 146 and the convoluted spring 154, and (2) the second space S2 between the recessed regions 120, 124, 126, and 127 provided on the cover plate 102 and the adjacent first surface 107 (the upper surface when viewing FIGS. 5 and 6) of the displaceable plate 146 and the convoluted spring 154. The relatively large thicknesses of the first and second spaces S1 and S2 is selected so as to prevent one or more particles (not shown) contained in the fluid moving through the microvalve 100 from becoming jammed therebetween, or at least to minimize the number of such particles that may become jammed therebetween.

The illustrated microvalve 100 is an on-off plate microvalve and may be actuated by a pilot valve, schematically illustrated at 170. The pilot valve may be any desired valve that supplies a command pressure to the pressure control port 116, such as a microvalve or a standard-sized pilot valve.

Fluid pressure at the pressure control port 116 may urge the displaceable plate 146 against the force of the convoluted spring 154, thereby moving the microvalve 100 to the open position shown in FIG. 6.

The embodiment of the on-off plate microvalve 100 of this invention and illustrated in FIGS. 2 through 6 is configured as a normally closed valve. It will be understood however, that the on-off plate microvalve 100 may also be configured as a normally open valve. The embodiment of the plate microvalve 100 of this invention is also packaged in a flow through configuration, wherein the fluid inlet port 114 and the fluid outlet port 112 are located on opposite sides of the microvalve 100. It will be understood however, that the improved sealing structures of this invention may be applied to an on-off plate microvalve having a conventional U-flow configuration.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A microvalve comprising:
  a first plate including a surface, a first recessed region provided within the surface, a second recessed region formed within a surface of the first recessed region, a fluid port provided within the second recessed region, and a sealing structure extending about the fluid port; and
  a second plate defining a non-movable portion and a movable portion, a surface of the non-movable portion abutting the surface of the first plate, the non-movable portion having first and second openings formed therethrough, the first opening having a notch formed in each of two longitudinally extending side walls thereof, the movable portion formed within the first opening and having an axis, the movable portion defining a displaceable member connected to the non-movable portion by a convoluted spring formed in a second opening, the displaceable member having a tab extending outwardly from each of two longitudinally extending side walls thereof, each tab positioned within one of the notches, the displaceable member slidingly and axially movable within the first opening between a closed position, wherein the displaceable member cooperates with the sealing structure to prevent fluid communication through the fluid port, and an opened position, wherein the displaceable member does not cooperate with at least a portion of the sealing structure to prevent fluid communication through the fluid port, the notches defining stop surfaces that limit travel of the displaceable member between the closed position and the open position.

2. The microvalve according to claim 1, wherein the microvalve is an on-off plate microvalve.

3. The microvalve according to claim 1, wherein the microvalve is a pilot operated on-off plate microvalve.

4. The microvalve according to claim 1, wherein the microvalve has a U-flow through configuration.

5. The microvalve according to claim 1, wherein a first space having a first thickness is defined between the displaceable member and the recessed region of the first plate and a second space having a second thickness is defined between the displaceable member and the sealing structure of the first plate, wherein the first thickness is greater than the second thickness.

6. The microvalve according to claim 1, wherein the second plate defines a plane, and wherein the displaceable member moves parallel to the plane when moved between the closed and opened positions.

7. The microvalve according to claim 1, wherein the displaceable member is configured as a plate having a fluid flow opening formed therethrough.

8. The microvalve according to claim 1, further including a third recessed region formed within the surface of the first plate adjacent the second recessed region, wherein a channel is formed through a wall that separates the second recessed region from the third recessed region, the channel fluidly connecting the second recessed region and the third recessed region and defining a feedback port.

9. A microvalve comprising:
  a base plate including a surface, a recessed region provided within the surface, a first fluid port provided within the recessed region, and a first sealing structure extending about the first fluid port;
  a cover plate including a surface, a recessed region provided within the surface, a second fluid port and a pressure equalization trough provided within the recessed region, and a second sealing structure extending about the pressure equalization trough; and
  an intermediate plate defining a non-movable portion and a movable portion, a first surface of the non-movable portion abutting the surface of the base plate and a second surface of the non-movable portion abutting the surface of the cover plate, the non-movable portion having first and second openings formed therethrough, the first opening having a notch formed in each of two longitudinally extending side walls thereof, the movable portion formed within the first opening and having an axis, the movable portion defining a displaceable member connected to the non-movable portion by a convoluted spring formed in a second opening, the displaceable member having a tab extending outwardly from each of two longitudinally extending side walls thereof, each tab positioned within one of the notches, the displaceable member slidingly and axially movable within the first opening between a closed position, wherein the displaceable member cooperates with at least one of the first and second sealing structures to prevent fluid communication between the first and second fluid ports, and an opened position, wherein the displaceable member does not cooperate with at least a portion of at least one of the first and second sealing structures to prevent fluid communication between the first and second fluid ports, the notches defining stop surfaces that limit travel of the displaceable member between the closed position and the open position, wherein a first space having a first thickness is defined between the displaceable member and the recessed region of the base plate, a second space having a second thickness is defined between the displaceable member and the first sealing structure of the base plate, wherein the first thickness is greater than the second thickness, a third space having the first thickness is defined between the displaceable member and the recessed region of the cover plate, and a fourth space having the second thickness is defined between the displaceable member and the second sealing structure of the cover plate.

10. The microvalve according to claim 9, wherein the microvalve is an on-off plate microvalve.

11. The microvalve according to claim 9, wherein the microvalve is a pilot operated on-off plate microvalve.

12. The microvalve according to claim 9, wherein the microvalve has a U-flow configuration.

13. The microvalve according to claim 9, wherein the intermediate plate defines a plane, and wherein the displaceable member moves parallel to the plane when moved between the closed and opened positions.

14. The microvalve according to claim 9, wherein the displaceable member is configured as a plate having a fluid flow opening formed therethrough.

15. A microvalve comprising:

a base plate including a surface, a first recessed region provided within the surface, a second recessed region formed within a surface of the first recessed region, a first fluid port provided within the second recessed region, and a first sealing structure extending about the first fluid port;

a cover plate including a surface, a recessed region provided within the surface, a second fluid port and a pressure equalization trough provided within the recessed region, and a second sealing structure extending about the pressure equalization trough; and an intermediate plate defining a non-movable portion and a movable portion, a first surface of the non-movable portion abutting the surface of the base plate and a second surface of the non-movable portion abutting the surface of the cover plate, the non-movable portion having first and second openings formed therethrough, the first opening having a notch formed in each of two longitudinally extending side walls thereof, the movable portion formed within the first opening and having an axis, the movable portion defining a displaceable member connected to the non-movable portion by a convoluted spring formed in a second opening, the displaceable member having a tab extending outwardly from each of two longitudinally extending side walls thereof, each tab positioned within one of the notches, the displaceable member slidingly and axially movable within the first opening between a closed position, wherein the displaceable member cooperates with at least one of the first and second sealing structures to prevent fluid communication between the first and second fluid ports, and an opened position, wherein the displaceable member does not cooperate with at least a portion of at least one of the first and second sealing structures to prevent fluid communication between the first and second fluid ports, the notches defining stop surfaces that limit travel of the displaceable member between the closed position and the open position.

16. The microvalve according to claim 15, further including a third recessed region formed within the surface of the base plate adjacent the second recessed region, wherein a channel is formed through a wall that separates the second recessed region from the third recessed region, the channel fluidly connecting the second recessed region and the third recessed region and defining a feedback port.

* * * * *